US012596858B1

(12) United States Patent
Aneja et al.

(10) Patent No.: US 12,596,858 B1
(45) Date of Patent: Apr. 7, 2026

(54) MACHINE-LEARNING MODEL FOR CIRCUIT DESIGN REQUIREMENTS VERIFICATION

(71) Applicant: Synopsys, Inc., Mountain View, CA (US)

(72) Inventors: Tanu Aneja, Noida (IN); Nusrat Ali, Delhi (IN); Apoorva Mathur, New Delhi (IN); Jitendra Puri, New Delhi (IN)

(73) Assignee: Synopsys, Inc., Sunnyvale, CA (US)

( * ) Notice: Subject to any disclaimer, the term of this patent is extended or adjusted under 35 U.S.C. 154(b) by 588 days.

(21) Appl. No.: 18/074,682

(22) Filed: Dec. 5, 2022

(51) Int. Cl.
| | |
|---|---|
| *G06F 30/323* | (2020.01) |
| *G06F 30/33* | (2020.01) |
| *G06F 40/169* | (2020.01) |
| *G06F 40/177* | (2020.01) |
| *G06F 40/205* | (2020.01) |
| *G06F 40/253* | (2020.01) |
| *G06F 40/258* | (2020.01) |
| *G06F 40/289* | (2020.01) |
| *G06N 20/00* | (2019.01) |
| *G06T 11/20* | (2006.01) |

(52) U.S. Cl.
CPC ............ *G06F 30/323* (2020.01); *G06F 30/33* (2020.01); *G06F 40/169* (2020.01); *G06F 40/177* (2020.01); *G06F 40/205* (2020.01); *G06F 40/253* (2020.01); *G06F 40/258* (2020.01); *G06F 40/289* (2020.01); *G06N 20/00* (2019.01); *G06T 11/206* (2013.01)

(58) Field of Classification Search
CPC .... G06F 30/323; G06F 40/258; G06F 40/253; G06N 20/00

USPC ........................................................ 716/103
See application file for complete search history.

(56) References Cited

U.S. PATENT DOCUMENTS

| | | | | |
|---|---|---|---|---|
| 9,058,317 | B1 * | 6/2015 | Gardner | G06F 40/268 |
| 10,140,101 | B2 * | 11/2018 | Allen | G06F 9/54 |
| 10,776,082 | B2 * | 9/2020 | Dey | G06F 40/30 |
| 11,321,607 | B2 * | 5/2022 | Shah | G06N 20/00 |
| 12,299,357 | B1 * | 5/2025 | Statter | G06F 30/38 |
| 12,299,423 | B2 * | 5/2025 | Cremeans | G06F 8/22 |
| 2004/0103380 | A1 * | 5/2004 | Bohl | G06F 30/00 |
| | | | | 716/136 |
| 2004/0128641 | A1 * | 7/2004 | Broberg, III | G06F 30/327 |
| | | | | 716/102 |
| 2008/0015838 | A1 * | 1/2008 | Stern | G06F 30/30 |
| | | | | 703/15 |
| 2011/0239182 | A1 * | 9/2011 | Nitta | G06F 30/30 |
| | | | | 716/135 |

(Continued)

*Primary Examiner* — Suchin Parihar
(74) *Attorney, Agent, or Firm* — Fenwick & West LLP

(57) ABSTRACT

A method or system for processing a specification document associated with a circuit design to identify design requirements. The method includes receiving a specification document associated with a circuit design, and processing the specification document to identify at least one of a text component, a table component, or a finite state machine (FSM). After that, the text component is parsed by a first parser to identify a first set of design requirements. The table component is parsed by a second parser to identify a second set of design requirements. The FSM component is parsed by a third parser to identify a third set of design requirements. The identified first, second, and/or third set of design requirements are then provided for display to a user for review.

20 Claims, 13 Drawing Sheets

(56)         References Cited

U.S. PATENT DOCUMENTS

| | | | |
|---|---|---|---|
| 2019/0095566 A1* | 3/2019 | Denisenko | G06F 30/343 |
| 2020/0057681 A1* | 2/2020 | Mamaghani | G06F 11/3648 |
| 2020/0167134 A1* | 5/2020 | Dey | G06F 8/65 |
| 2022/0171932 A1* | 6/2022 | Parthasarathy | G06N 20/20 |
| 2022/0197611 A1* | 6/2022 | Cremeans | G06F 8/73 |
| 2023/0153512 A1* | 5/2023 | Shapira | G01R 31/2848 |
| | | | 716/112 |
| 2023/0252209 A1* | 8/2023 | Zhu | G06F 30/337 |
| | | | 716/106 |
| 2024/0135084 A1* | 4/2024 | Parthasarathy | G06F 30/398 |
| 2024/0143892 A1* | 5/2024 | Saha | G06F 30/392 |
| 2025/0045492 A1* | 2/2025 | Koiek Akino | G06F 30/27 |
| 2025/0232196 A1* | 7/2025 | Zalivaka | G06V 30/42 |

* cited by examiner

Figures 4A, 4B:
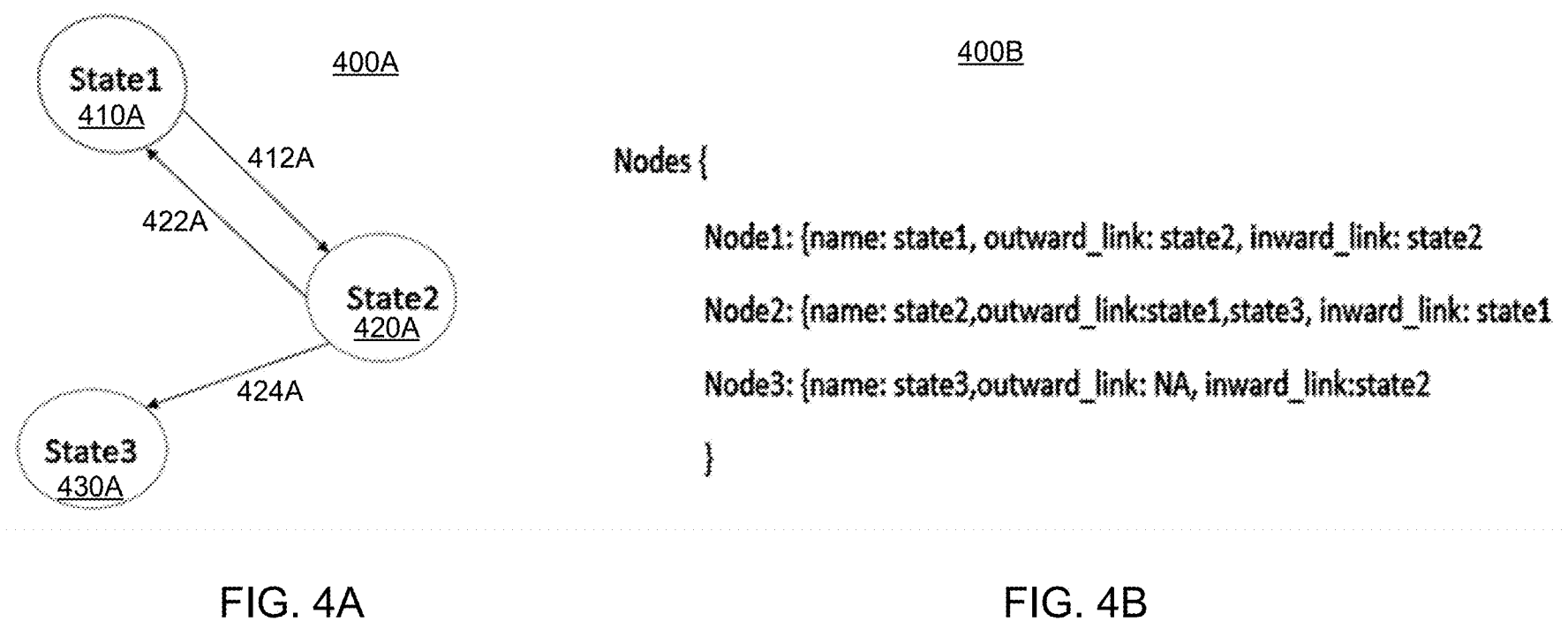

400B

```
Nodes {

Node1: {name: state1, outward_link: state2, inward_link: state2}

Node2: {name: state2,outward_link:state1,state3, inward_link: state1}

Node3: {name: state3,outward_link: NA, inward_link:state2}

State2
420A

412A

422A

424A

State1
410A

State3
430A

| Value_V1 | VA1 | VB1 |
| Value_V2 | VA2 | VB2 |
| Value_V3 | VA3 | VB3 |
| | Device A | Device B |

| | Min. Value | Max. Value |
|---|---|---|
| Value_V1 | MVmin1 | MVmax1 |
| Value_V2 | MVmin2 | MVmax2 |
| Value_V3 | MVmin3 | MVmax3 |

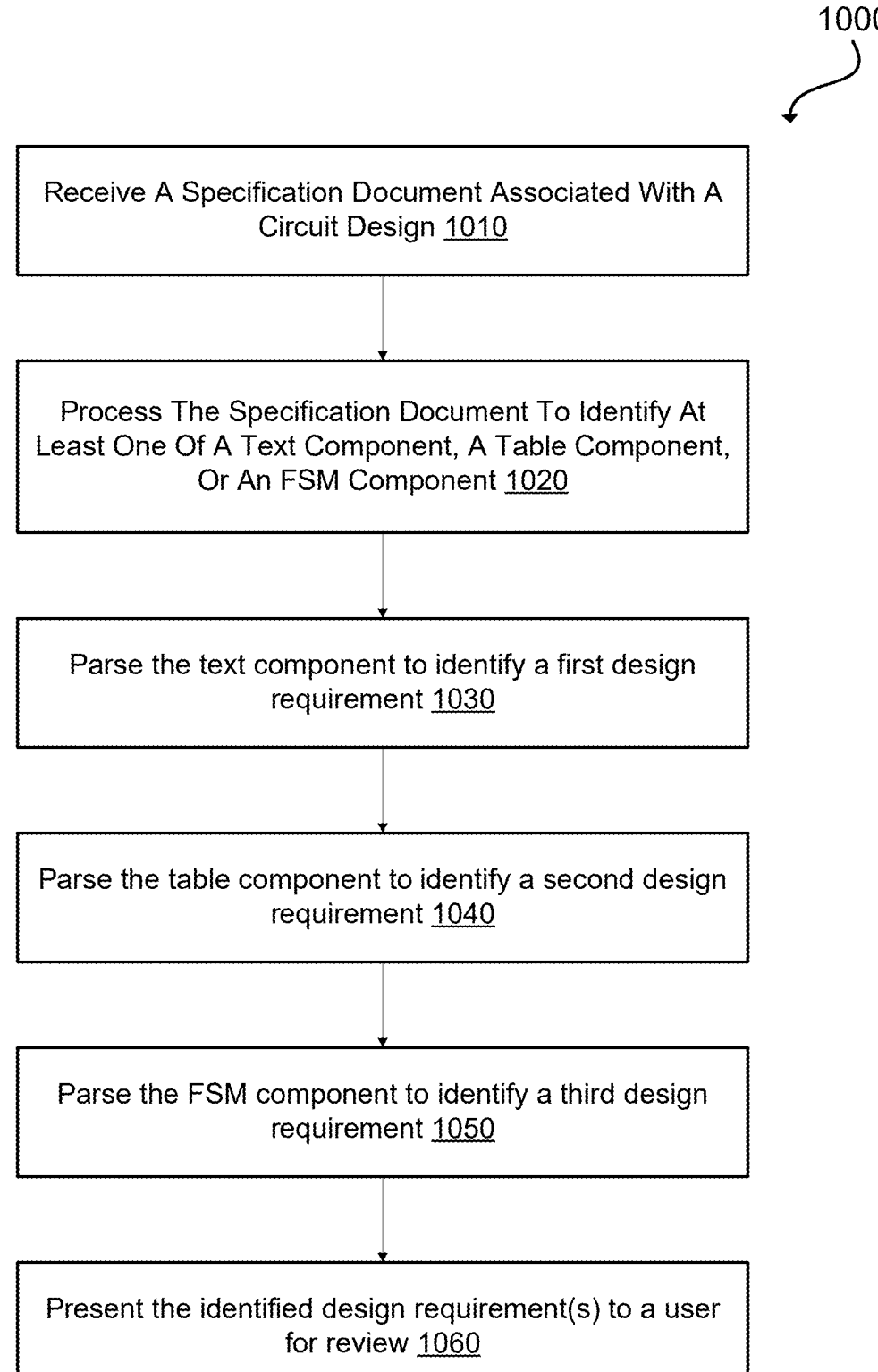

Receive A Specification Document Associated With A Circuit Design 1010

Process The Specification Document To Identify At Least One Of A Text Component, A Table Component, Or An FSM Component 1020

Parse the text component to identify a first design requirement 1030

Parse the table component to identify a second design requirement 1040

Parse the FSM component to identify a third design requirement 1050

Present the identified design requirement(s) to a user for review 1060

MACHINE-LEARNING MODEL FOR CIRCUIT DESIGN REQUIREMENTS VERIFICATION

TECHNICAL FIELD

The present disclosure relates to text and image processing, more specifically relates to using machine learning to parse a specification document associated with a circuit design to identify design requirements.

BACKGROUND

Functional verification has been an important phase in circuit design and/or chip development. Debugging is a time-consuming task for functional verification. In many cases, debugging may take more than 50% of functional verification. Often, a first step in debugging is to identify a rationale for the failures. A common practice for debugging is to implement assertions or protocol checks in a register transfer level (RTL) design and verification environment to report protocol violations to help locate the rationale for failures. In particular, adding checks and assertions for every protocol requirement can help track that RTL is comprehensively covering all requirements that are suitable for assertions and protocol checks. The success of this activity, however, relies on the comprehensive identification of all such requirements. Existing practice often includes manually identifying requirements from the specification of design, which is time-consuming and prone to errors.

SUMMARY

The embodiments described herein includes configurations (e.g., a method and/or a system) for identifying design requirements based on a specification document associated with a circuit design, such as a register-transfer level (RL) circuit design. By way of example, a configuration may include receiving a specification document associated with a circuit design, and processing the specification document to identify at least one of a text component, a table component, or a finite state machine (FSM) component. The configuraiton parses, by a first parser, the text component to identify a first set of design requirements. It also may parse, by a second parser, the table component to identify a second set of design requirements. It also may parse, by a third parser, the FSM component to identify a third set of design requirements. The identified design requirement(s) are presented, e.g., provided for display, on an electronic screen, to a user for review. In some embodiments, the specification document is a PDF file, and presenting the identified design requirement(s) includes annotating the PDF file based on the predicted design requirement.

In some embodiments, parsing, by the first parser, the text component includes parsing the text component using a natural language processor to identify sentences and verbs in the sentences, and using one or more machine-learning (ML) models to predict whether an identified sentence is likely to be a design requirement. At least one of the ML models is trained over a training dataset having (1) positive training samples containing a first set of phrases each of which is labeled as a design requirement, and (2) negative training samples containing a second set of phrases, each of which is labeled as not a design requirement.

In some embodiments, the one or more ML models include at least one of (1) a first ML model configured to predict whether an identified sentence is likely to be a protocol requirement, (2) a second ML model configured to predict whether an identified sentence is likely to be a function requirement, or (3) a third ML model configured to predict whether an identified sentence is likely to be a coverage requirement.

In some embodiments, the configuration further includes receiving a user input indicating the identified first set of design requirements is a wrong prediction, and including the wrong prediction in the training dataset as a negative training sample. In some embodiments, the configuration further includes receiving a user input indicating that the first set of design requirements is a missed prediction, and including the missed prediction in the training dataset as a positive training sample. In some embodiments, the configuration further includes receiving a user input indicating a requirement is a correct prediction, and comparing a vector corresponding to the correct prediction with vectors of the positive training samples in the training dataset to determine a similarity index. Responsive to determining that the similarity index is lower than a threshold, the missed prediction is included in the training dataset as a positive training sample.

In some embodiments, parsing, by the second parser, the table component includes determining that a horizontal relationship or a vertical relationship is present in the table component. Responsive to determining that the horizontal relationship is present, row headers of rows in the table are extracted, and a graph is generated, in which values in each row are child nodes of the corresponding row header, while column headers of columns in the table are extracted as constraints. Similarly, responsive to determining that the vertical relationship is present, column headers in the table are extracted, and a graph is generated, in which values in each column are child nodes of the corresponding column header, while row headers in the table are extracted as constraints.

In some embodiments, parsing, by the third parser, the FSM component includes identifying one or more circles and one or more arrows in the FSM component, extracting text information from the identified one or more circles, and generating a graph based on the text information, the one or more circles, and the one or more arrows. The one or more circles correspond to one or more nodes of the graph, and the one or more arrows correspond to relationship among the one or more nodes of the graph.

Other aspects include components, devices, systems, improvements, methods, processes, applications, computer-readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

Figure (FIG. 1 illustrates an example architecture of a requirement extraction system, in accordance with some embodiments.

FIGS. 4A and 4B illustrate an example of an FSM and a corresponding graph generated based on the FSM.

FIGS. 7A and 7B illustrate an example table and its corresponding graph, in which a vertical relationship is present.

FIGS. 8A and 8B illustrate an example table and its corresponding graph, in which a horizontal relationship is present.

FIG. 10 is a flowchart of a method for parsing a specification document associated with a circuit design to identify design requirements.

DETAILED DESCRIPTION

Functional verification has been an important phase in circuit design and/or chip development. Debugging is a time-consuming task for functional verification. In many cases, debugging may take more than 50% of functional verification. Often, a first step in debugging is to identify a rationale for the failures. A common practice for debugging is to implement assertions or protocol checks in a register transfer level (RTL) design and verification environment to report protocol violations to help locate the rationale for failures. In particular, adding checks and assertions for every protocol requirement can help track that register transfer logic (RTL) is comprehensively covering all requirements. The success of this activity, however, relies on the comprehensive identification of all the requirements. Existing practice often includes manually identifying requirements from the specification of design, which is time-consuming and prone to human errors.

Aspects of the present disclosure solve the above-described problem by using machine learning to parse a specification document associated with a circuit design to identify design requirements. Embodiments described herein include a method and/or a system (also referred to as a "requirement extraction system") for identifying design requirements based on a specification document associated with a circuit design, such as a register-transfer level (RL) circuit design. The specification may be in portable document format (PDF) format, text format, doc format, docx format, or any other format that may be applicable.

In some embodiments, the specification is divided into multiple components such as one or more text components, one or more table components, one or more FSM components, and/or one or more figure components, etc. Different parsers, modules, and or machine-learning (ML) models are configured or trained to extract requirements from the different components. In some embodiments, training data of the ML models are intelligently updated for improving the quality of requirements extraction. For example, in some embodiments, requirement extracted from a new specification (which may include user feedback and/or existing requirement document) are used as additional training data to continuously improve the ML models. As such, the ML models continue to improve themselves as time goes on.

Advantages of the present disclosure include, but are not limited to, enabling automatic identification of design requirements based on specification documents associated with circuit designs, and reducing computing time and resources required for debugging the circuit designs.

Figure 1:
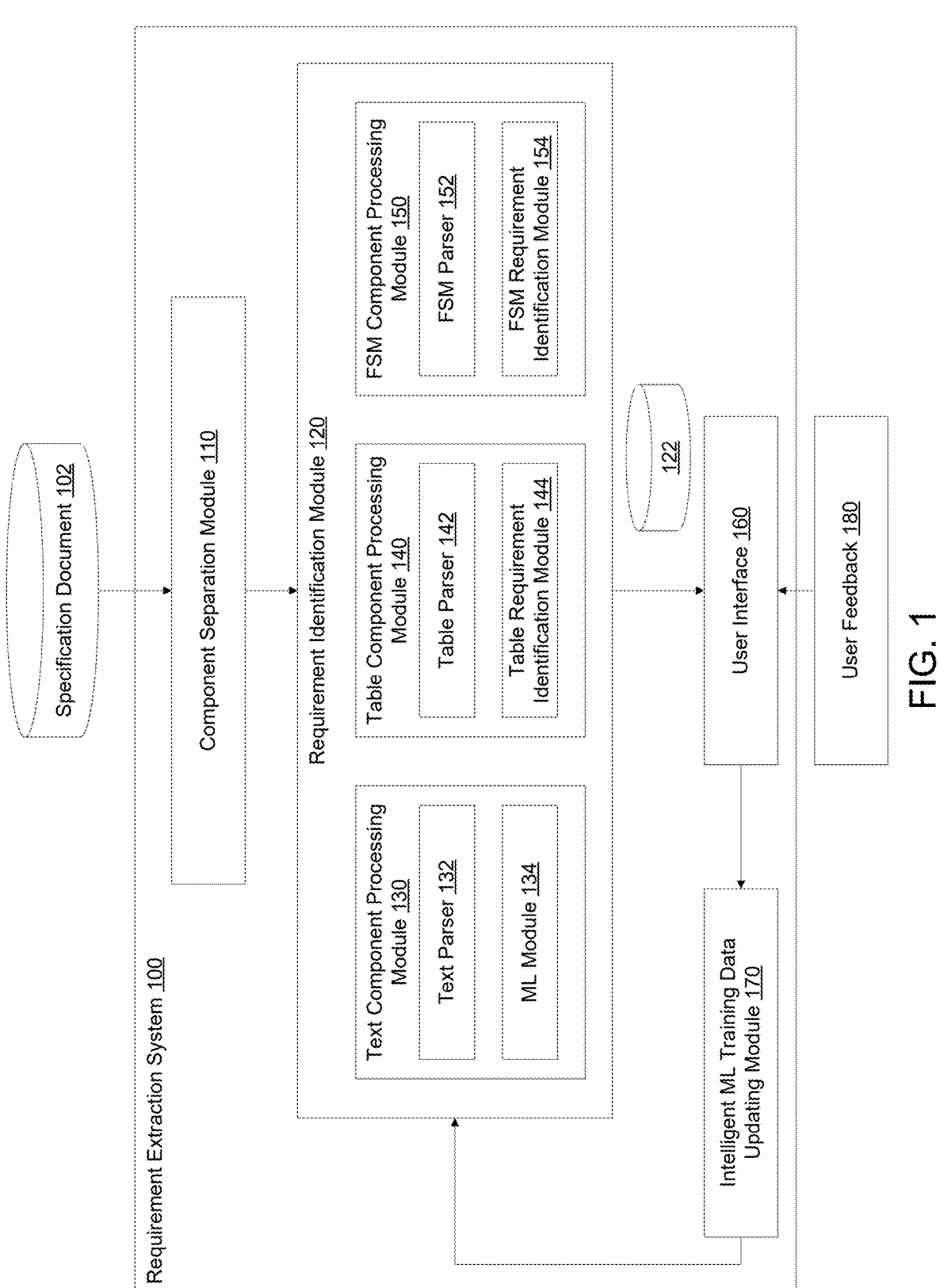

Referring to Figure (FIG. 1, it illustrates an example architecture of a requirement extraction system 100. The requirement extraction system includes a component separation module 110, a requirement identification module 120, a user interface 160, and an intelligent ML training data updating module 140.

The component separation module 110 is configured to identify and separate content in a specification into different components, each of which needs a different strategy for requirement extraction. In some embodiments, different components include at least a text component, a table component, and/or a finite state machine (FSM) component. Additional details about the component separation module 110 are further described below with respect to FIGS. 2-3 and 4A-4B.

The requirement extraction module 120 includes a text component processing module 130 configured to process text components, a table component processing module 140 configured to process table components, and an FSM component processing module 150 configured to process FSM components. In some embodiments, the text component processing module 130 includes a text parser 132 configured to parse data contained in the text components, and one or more ML model(s) 134 configured to further process the parsed text component to identify a first set of design requirements.

In some embodiments, the ML model(s) 134 are trained over one or more training datasets having (1) positive training samples containing a first set of phrases each of which is labeled as a design requirement, and (2) negative training samples containing a second set of phrases, each of which is labeled as not a design requirement. In some embodiments, a separate ML model is trained for a separate type of requirement. For example, in some embodiments includes a first ML model is trained to predict whether an identified sentence is likely to be a protocol requirement: a second ML model is trained to predict whether an identified sentence is likely to be a function requirement, and/or a third ML model is trained to predict whether an identified sentence is likely to be a coverage requirement. Additional details associated with the ML model(s) 134 are further discussed below with respect to FIG. 5.

In some embodiments, the table component processing module 140 includes a table parser 142 configured to parse data contained in table component, and a table requirement identification module 144 configured to identify a second set of requirements based on parsed table component. Additional details associated with the table requirement identification module 144 are further described below with respect to FIGS. 6, 7A-7B, and 8A-8B.

In some embodiments, the FSM component processing module 150 includes an FSM parser 152 and an FSM requirement identification module 154 configured to identify a third set of requirements based on parsed FSM components.

The first, second, and/or third set of requirements (collectively referred to as requirements 122) may be presented, e.g., provided for display, to a user via a user interface 160. In some embodiments, the specification document is a PDF file, and presenting the identified design requirement(s) includes annotating the PDF file based on the predicted design requirement.

In some embodiments, user interface 160 also may enable a user to input their feedback 180. The user feedback 180 may indicate whether a particular requirement is correctly or incorrectly identified. In some embodiments, the user interface 160 may also allow users to indicate whether a requirement is missed by the requirement extraction module 120. In some embodiments, the intelligent ML training data updating module 140 is configured to update training data of the ML model(s) 134 based on the user feedback 180. Additional details about the intelligent ML training data updating module 170 are further described below with respect to FIG. 9.

Figure 2:
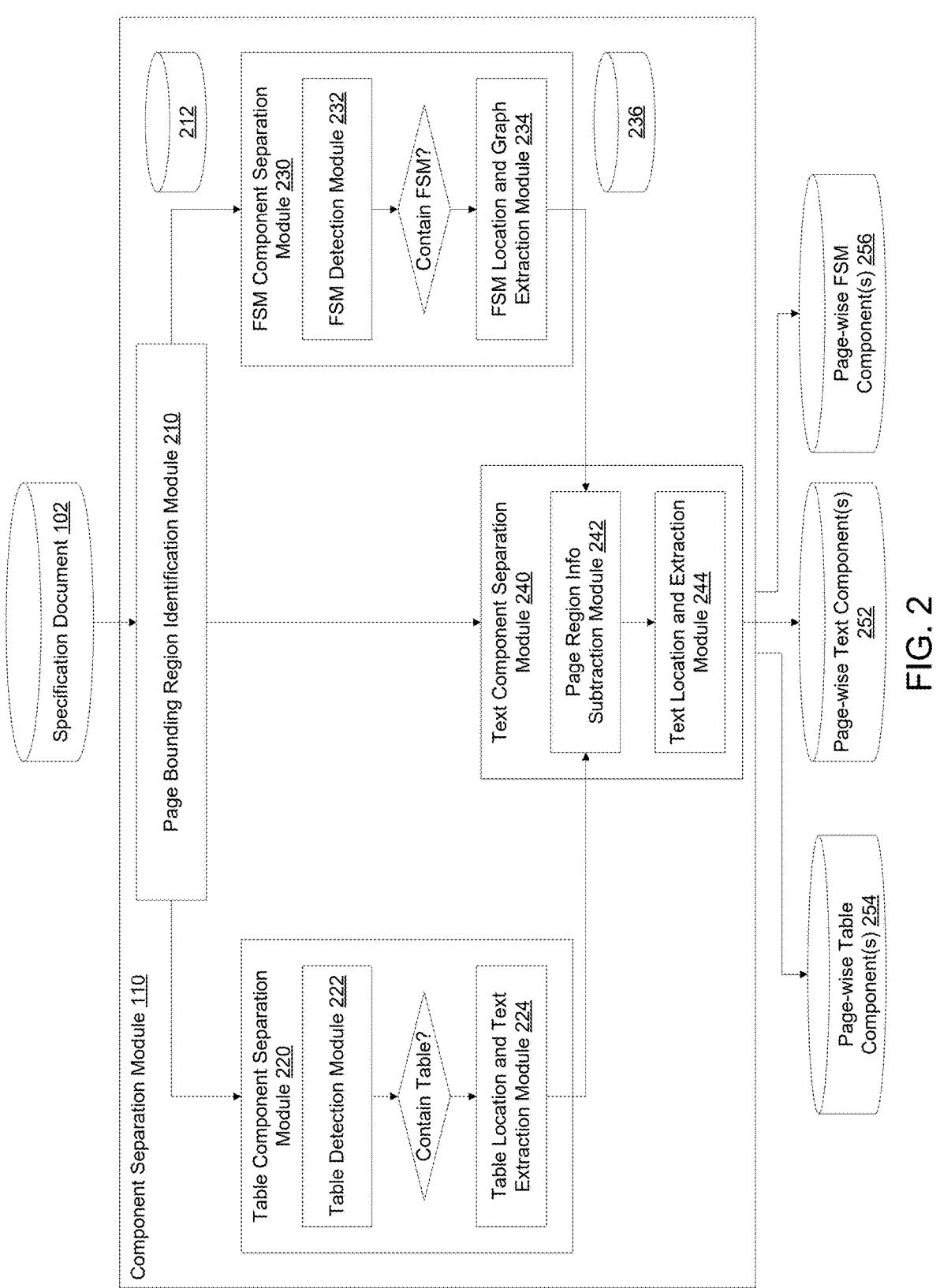
FIG. 2 illustrates an example architecture of a component separation module.

FIG. 2 illustrates an example architecture of a component separation module 110, which corresponds to the component separation module 110 of FIG. 1. The component separation module 110 is configured to receive a specification document 102 as input. For each page of the specification document 102, the component separation module 110 is configured to output page-wise table components 252, page-wise text components 254, and/or page-wise FSM components 256.

In some embodiments, the component separation module 110 includes a page bounding region identification module 210, a table component separation module 220, a text component separation module 240, and an FSM component separation module 230. The page bounding region identification module 210 is configured to identify each page of the specification document 102, and identify a page bonding region of each page. For example, the page bounding region identification module 210 may be configured to identify a header, a footer, and/or margins of each page, and exclude information related to the header, footer, and/or margins from the page bounding region. In some embodiments, coordinates, such as top left, bottom right, etc., associated with boundaries or corners of each page are identified.

The table component separation module 220 is configured to detect and separate table components from each page bounding region. The FSM component separation module 230 is configured to detect and separate FSM components from each page bounding region. The text component separation module 240 is configured to detect and separate text components from each page bounding region.

In some embodiments, the table component separation module 220 includes a table detection module 222 and a table location and text extraction module 224. The table detection module 222 is configured to detect whether at least one table is in the page bounding region. Responsive to detecting at least one table in the page bounding region, the table location and text extraction module 224 is configured to identify a location of each detected table and extract text contained therein.

In some embodiments, the FSM component separation module 230 includes an FSM detection module 232 and an FSM location and graph extraction module 234. The FSM detection module 232 is configured to detect whether at least one FSM is in the page bounding region. Responsive to detecting at least one FSM in the page bounding region, the FSM location and graph extraction module 234 is configured to identify a location of each detected FSM and extract a graph contained therein. Note, each graph includes a plurality of interrelated nodes linked by arrows, and each node may also be associated with some text. The text contained in each node or associated with the arrows may also be extracted.

The text component separation module 240 includes a page region info subtraction module 242 and a text location and extraction module 244. The page region info subtraction module 242 is configured to extract text contained in the table or FSM from text in the page region. The text location and extraction module 244 is configured to identify locations of the text (that is not contained in the table or FSM).

The output of the component separation module 110 includes page-wise text components 252 (which are further processed by the text component processing module 130), page-wise table components 254 (which are further processed by the table component processing module 140), and page-wise FSM components 256 (which are further processed by the FSM component processing module 150).

Note, some of the modules shown in the component separation module 110 of FIG. 2 may be embodied in the requirement identification module 120 of FIG. 1. Similarly, some of the components shown in the requirement identification module 120 of FIG. 1 may be implemented in the component separation module 110.

Figure 3:
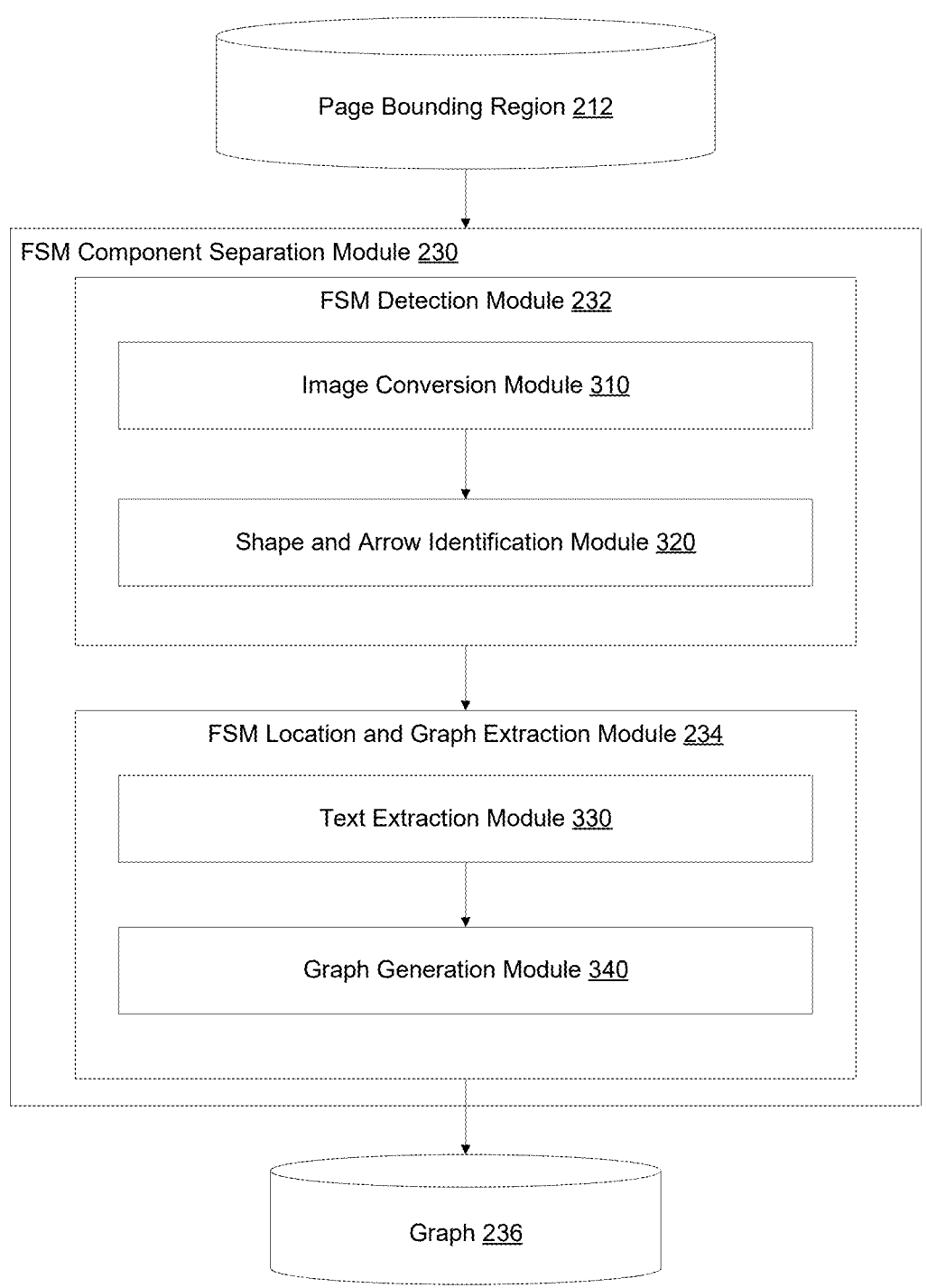
FIG. 3 illustrates an example architecture of a finite state machine (FSM) component separation module.

FIG. 3 illustrates an example architecture of FSM component separation module 230, which may be implemented in FSM parser 152 of FIG. 1. The FSM component processing module 230 includes FSM detection module 232 and FSM location and graph extraction module 234. The FSM detection module 232 includes an image conversion module 310 and a shape and arrow identification module 320. The image conversion module 310 is configured to receive page bounding region 212 and convert the page bounding region into an image. The shape and arrow identification module 320 is configured to identify shapes (such as circles) and arrows in the image. For example, it is common that FSM includes circles and arrows.

The FSM location and graph extraction module 234 includes a text extraction module 330 and a graph generation module 340. The text extraction module 330 is configured to extract text inside the identified shape (e.g., circle) and generate a graph 236 based on the text and arrows linking the shapes. FSM requirement identification module 154 then uses this graph to detect valid/invalid state transitions as design requirements.

FIGS. 4A and 4B illustrate an example of an FSM 400A and a corresponding graph 400B generated based on the FSM 400A. As illustrated in FIG. 4A, the FSM 400A includes three circles and three arrows. Each circle represents a node, and text inside the circles represent their corresponding states. For example, node 410A (also referred to as node 1) is in state 1, node 420A (also referred to as node 2) is in state 2, and node 430A (also referred to as node 3) is in state 3. Arrow 412A pointing from node 410A to node 420A represents a link from state 2 to state 1: arrow 422A pointing from node 420A to 410A represents a link from state 2 to state 1; and arrow 424A pointing from node 420A to 430A represents a link from state 2 to state 3.

As illustrated in FIG. 4B, the graph 400B may be represented in JSON format. The JSON object may be named "Nodes," including three nodes, namely Node1, Node2, and Node3. Node1 (which corresponds to node 410A) includes an outward link 412A and an inward link 422A to and from Node2 (which corresponds to node 420A). Node2 includes an inward link 412A from Node1 and two outward links 422A and 424A from Node1 and Node3 (which corresponds to node 430A), respectively.

Figure 5:
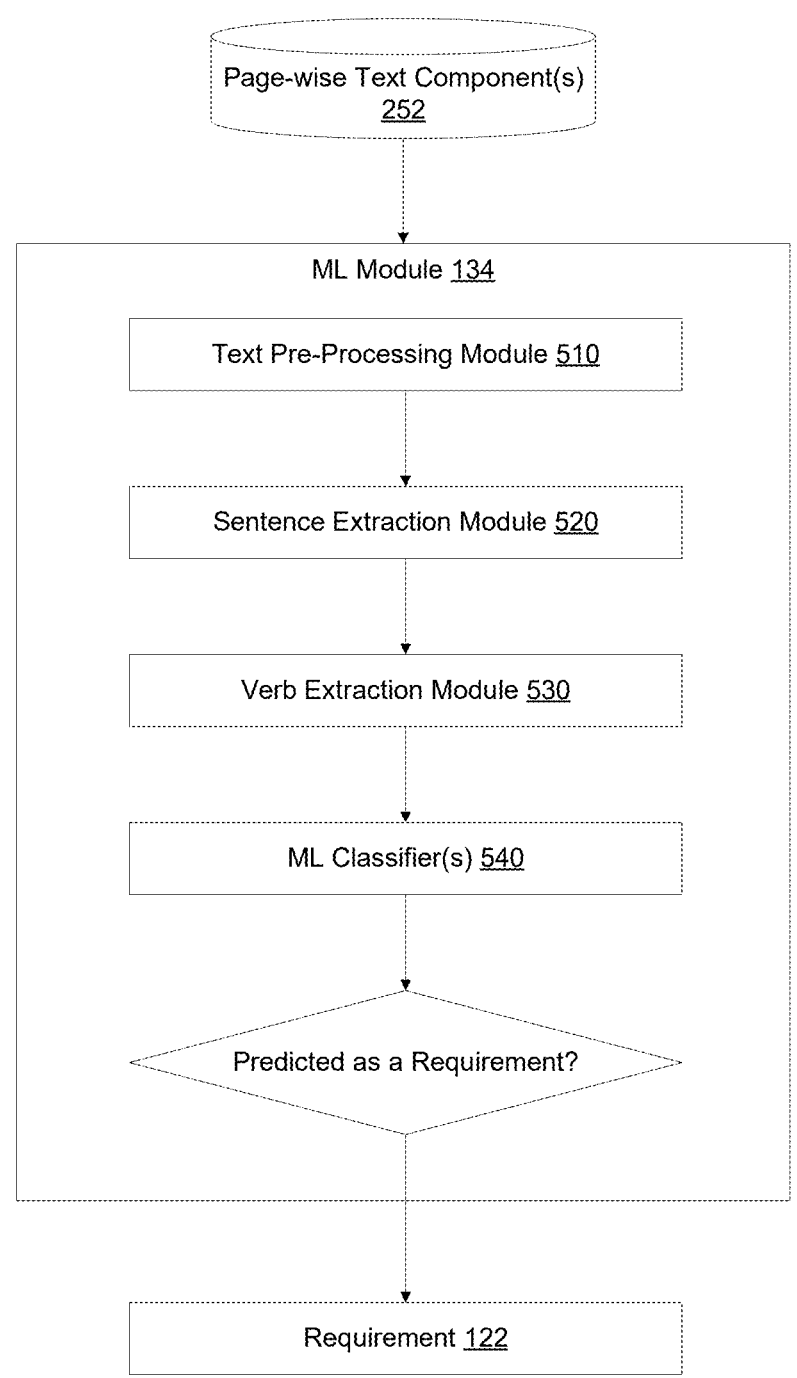
FIG. 5 illustrates an example architecture of a machine-learning (ML) model configured to identify text-related design requirements.

FIG. 5 illustrates an example architecture of the ML model 134, which corresponds to the ML model 134 of FIG. 1. The ML model 134 is configured to receive page-wise text components 252 to predict one or more requirements 122. In some embodiments, the ML model(s) 134 includes a text pre-processing module 510, a sentence extraction module 520, a verb extraction module 430, and one or more ML classifier(s) 540. The text-preprocessing module 410 is configured to preprocess the text contained in the text components 252. In some embodiments, the text preprocessing module 510 is based on natural language processing (NLP) technologies, configured to remove junk characters, replace abbreviated words with original words, etc.

The sentence extraction module 420 is configured to extract sentences from the preprocessed text. The verb extraction module 430 is configured to extract verbs from the sentences. In some embodiments, sentences that include no verb are generally ignored. In some embodiments, short sentences that have no more than 4 words are also ignored. Each of the rest of the sentences with at least one verb is then processed by the ML classifier 440. The ML classifier 440 is configured to predict whether each of these sentences is likely a design requirement. In some embodiments, multiple classifiers are trained, each of which is trained to detect a type of requirement. For example, a first ML classifier is trained to predict whether a sentence is a protocol requirement, a second ML classifier is trained to predict a function requirement, and/or a third ML classifier is trained to predict a coverage requirement.

Figure 6:
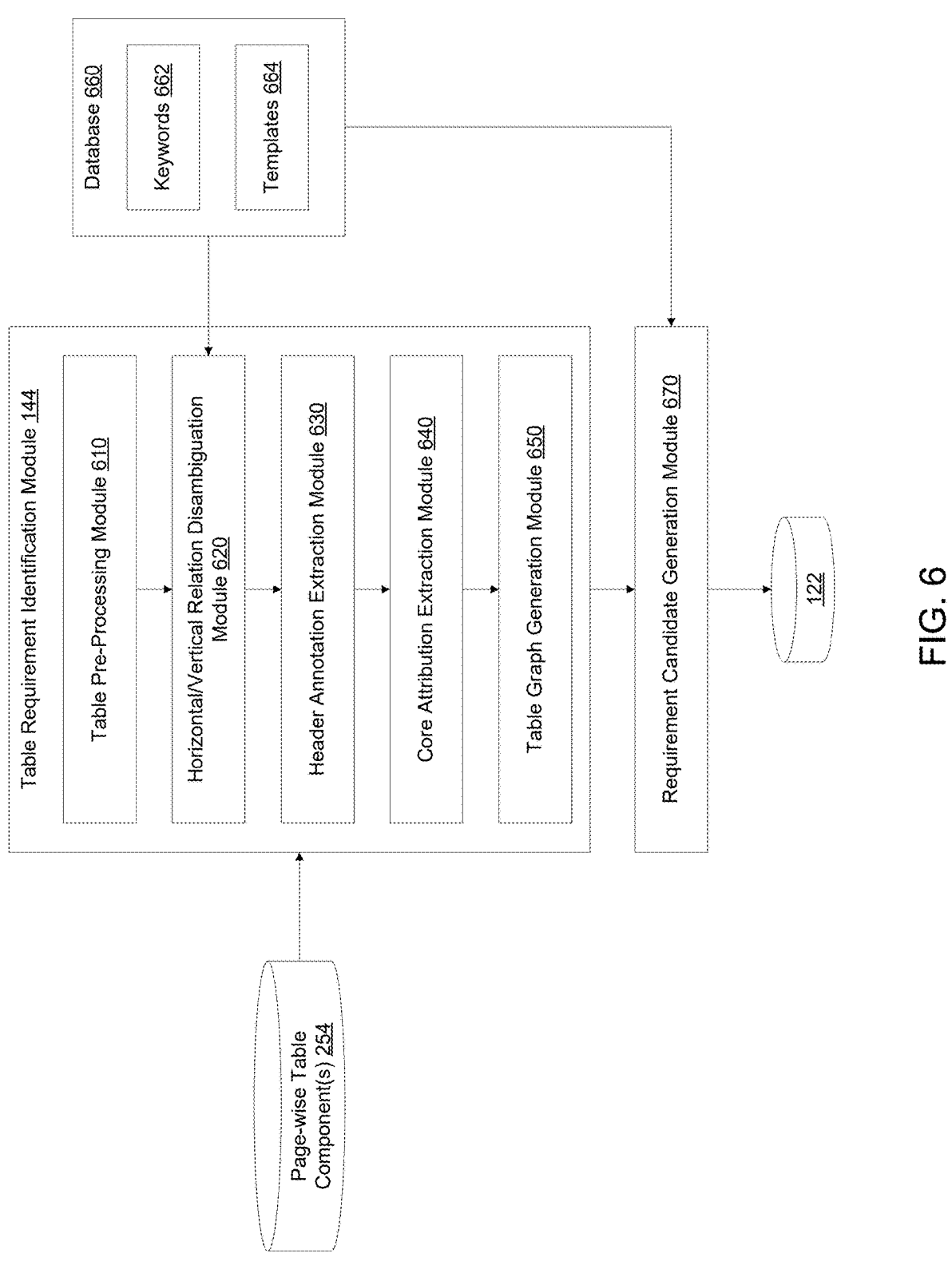
FIG. 6 illustrates an example table requirement identification module configured to receive page-wise table components from the component separation module to identify design requirements.

FIG. 6 illustrates an example table requirement identification module 144 (corresponding to the table requirement identification module 144 of FIG. 1) configured to receive page-wise table components 254 from the component separation module 110 to identify requirement 122 based on the table components 254. The table requirement identification module 144 includes a table preprocessing module 610, a horizontal/vertical relationship disambiguation module 620, a header annotation extraction module 630, a core attribution extraction module 640, and/or a table graph generation module 650. In some embodiments, the table preprocessing module 610 is based on NLP techniques to extract meaningful words from text contained in the table components 254.

The horizontal/vertical relationship disambiguation module 620 is configured to identify if rows or columns of a table should be considered for extracting requirements. In some embodiments, a database 660 is implemented to record keywords 662 and templates 664 associated with tables. The horizontal/vertical relationship disambiguation module 620 is configured to compare text contained in the rows or columns of the table with the keyword 662 and templates 664 stored in the database 660 to determine whether rows or columns of the table should be considered for extracting requirements. In some embodiments, by default, a table is considered as having horizontal relation, i.e., each row is considered as a requirement with column headers representing constraints.

In some embodiments, the system analyzes a first row and/or a first column of each table to determine whether the table presents a vertical relationship (also referred to as a vertical table) or a horizontal relationship (also referred to as a horizontal table). In some embodiments, a first set of keywords 662 in the first row or column are associated with vertical tables. Responsive to determining that at least one keyword in the first set of keywords 662 is contained in the first row or the first column, it is determined that a vertical relationship is present in the table. In some embodiments, a second set of keywords 662 in the first row or column are associated with horizontal tables. Responsive to determining that at least one keyword in the second set of strings is present in the first row or the first column of a table, it is determined that a horizontal relationship is present in the table.

Once it is determined whether a table is a horizontal table or a vertical table, header annotation extraction module 630 is configured to extract column headers or row headers, and the core attribution extraction module 640 is configured to extract core attributions from the cells of the table. The table graph generation module 640 is configured to generate a graph based on the extracted column or row headers and core attributions.

The requirement candidate generation module 670 is configured to match the row or column headers with database 660 to find similar requirements. When it is determined horizontal relationship exists, for each row, a requirement is generated with constraints as values for each column header. For example, a table can have minimum or maximum timing for certain variables. Then, for each row cell, a requirement will be generated with the row header as the value and the column header as a constraint on that value.

Similarly, when it is determined vertical relationship exists, each column header is considered a value, with each row header as a constraint. For such a relationship, a requirement may be identified with a column header as a value and a row header as a constraint on that value. In some embodiments, special cases may be present. For example, reserved keywords may be in a cell, and such reserved keywords may be reported as requirements. In some embodiments, the requirements 122 are merged with text and table-based requirements, and presented to a user for review or feedback.

Figure 7B:
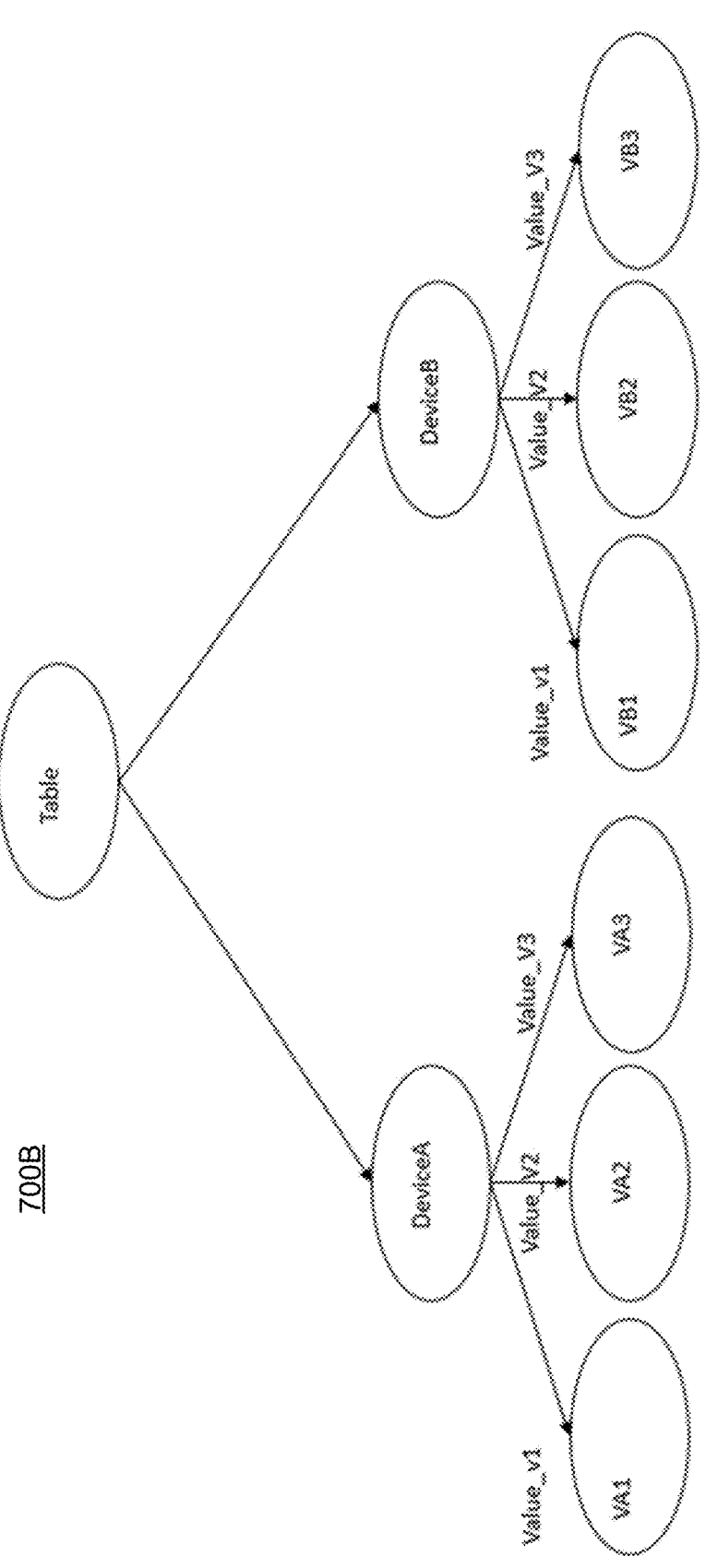

FIGS. 7A and 7B illustrate an example table 700A and its corresponding graph 700B, in which a vertical relationship is present. "Table" may be denoted as a root note, and each column header may be used as a child node of the root node. At the same time, each column header is also a parent node for each cell value in that column. As illustrated in FIGS. 7A and 7B, in table 700A, column headers include Device A and Device B, each of which becomes a child node of the root node. In the column of device A, three values VA1, VA2, VA3 become three child nodes of the node Device A. In the column of device B, three values VB1, VB2, VB3 become three child nodes of the node Device B. The row header Value_V1, Value_V2, and Value_V3 are constraints of the child nodes VA1, VA2, and VA3, and VB1, VB2, and VB3 respectively.

Figure 8B:
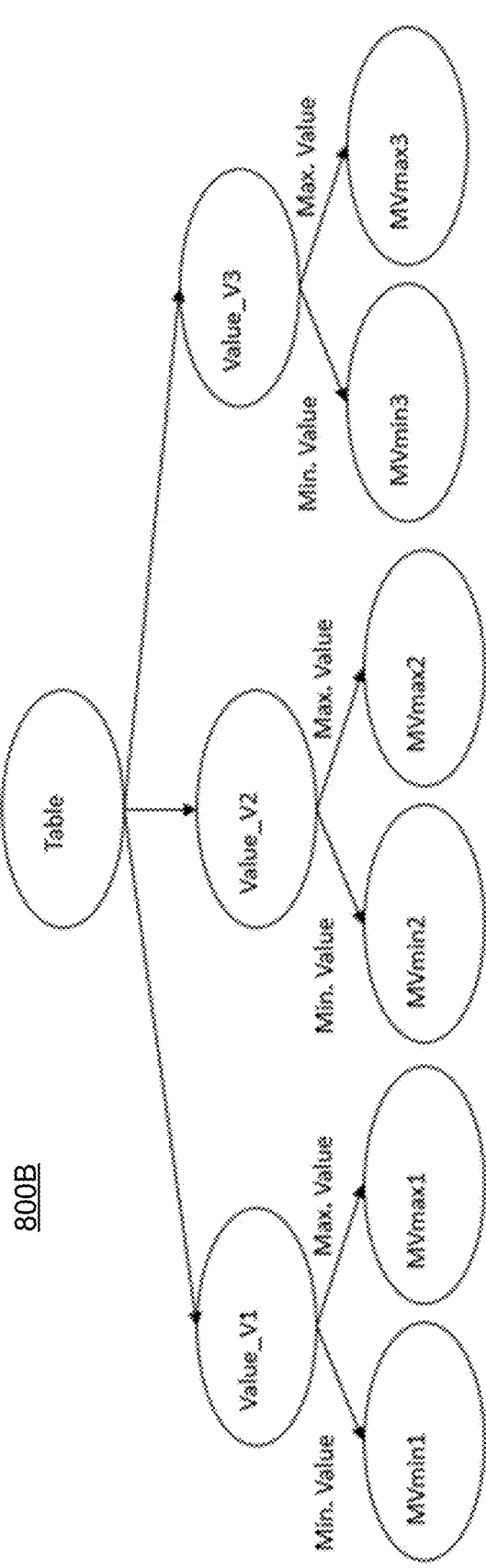

FIGS. 8A and 8B illustrate an example table 800A and its corresponding graph 800B, in which a horizontal relationship is present. Here, "table" may also be denoted as a root node, and each row header may be used as a child node of the root node. At the same time, each row header is also a parent node for each cell value in that row. As illustrated in FIGS. 8A and 8B, in table 800A, row headers include Value_V1, Value_V2, and Value_V3, each of which becomes a child node of the root node. In the row of Value_V1, two values MVmin1 and MVmax 1 become two child nodes of the node Value_V1. In the row of Value_V2, two values MVmin2 and MVmax 2 become two child nodes of the node Value_V2. Similarly, in the row of Value_V3, two values MVmin3 and MVmax3 become two child nodes of the node Value_V3. The column header Min. Value and Max. Value are constraints of the child nodes MVmin1, MVmax1; MVmin2, MVmax2; and MVmin3, and MVmax3 respectively.

Figure 9:
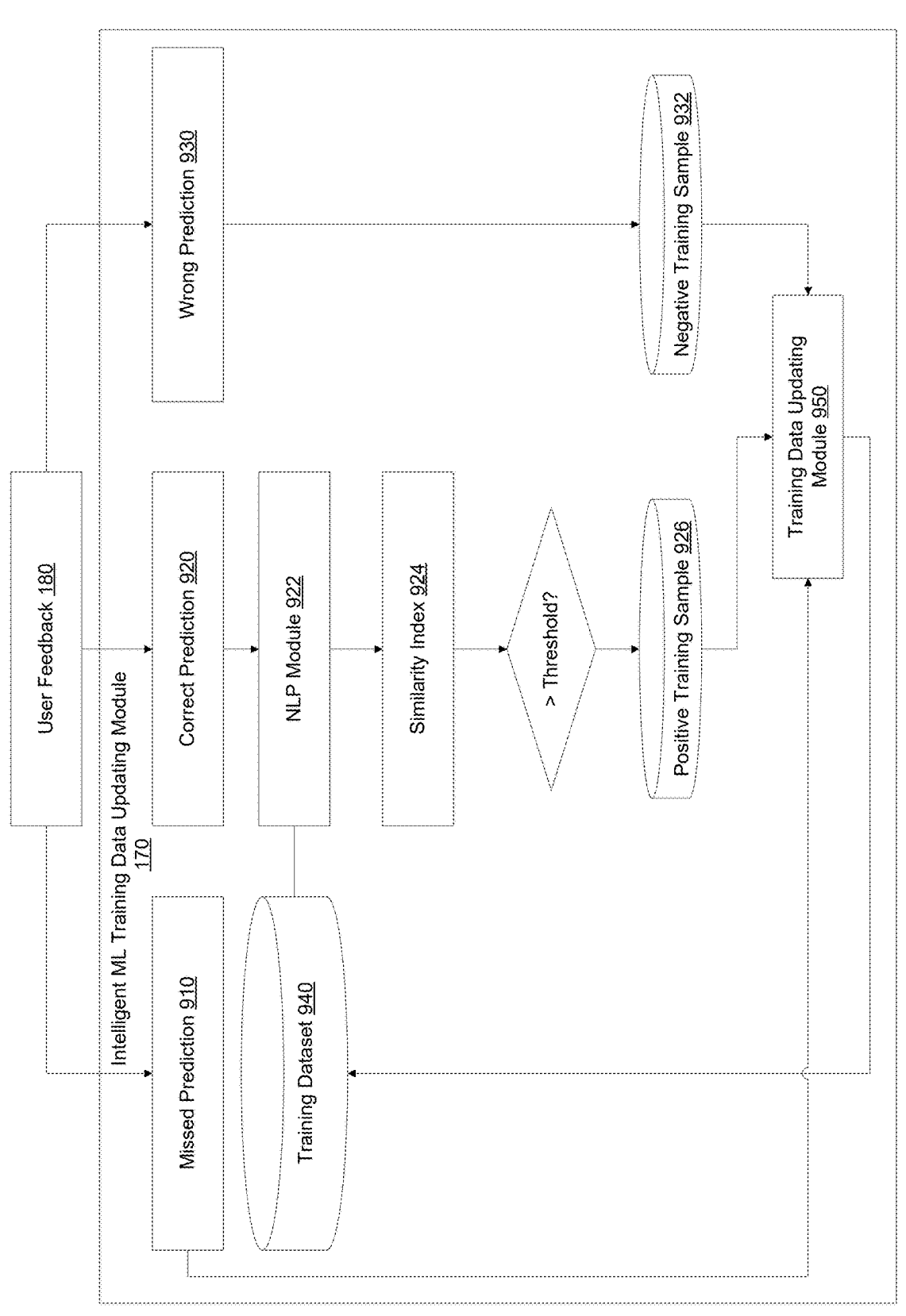
FIG. 9 illustrates an example embodiment of an intelligent ML training data updating module based on user feedback.

FIG. 9 illustrates an example embodiment of the intelligent ML training data updating module 170 based on user feedback 180. The user feedback 180 includes a plurality of types of feedback, such as missed prediction 910, correct prediction 920, and/or wrong prediction 930. Missed prediction 910 indicates that a requirement is present, but the requirement extraction system 100 fails to identify it. Data associated with the missed requirement may be used as a Positive Training Sample 926. Wrong prediction 930 indicates that a predicted requirement should not have been a requirement. Data associated with the wrong prediction 930 may be used as a negative training sample 932.

Correct prediction 920 indicates that a predicted requirement is a correct requirement. In some embodiments, Data associated with the correct prediction 920 may be used as a Positive Training Sample 926 too. Alternatively, or in addition, the correct prediction 920 is further processed by an NLP module 922 to identify vectors associated with existing training data (e.g., positive training samples) that are similar to the correct prediction. A greater difference between the correct prediction and an existing training sample indicates that the inclusion of the correct prediction is more helpful to improve the ML model. For example, if the correct prediction is identical to an existing training sample, there is no need to include the correct prediction in the positive training samples. However, if the correct prediction is far from all the existing positive training samples, it would be more meaningful to include the correct prediction as an additional positive training sample. In some embodiments, a similarity index 924 is computed, indicating how similar the correct prediction is compared to the existing positive training samples. Only when the similarity index 924 is lower than a threshold (i.e., the correct prediction 920 is sufficiently different from the existing training samples), the correct prediction 920 is included as a Positive Training Sample 926.

The training data updating module 950 is configured to update the training dataset 940 to include the additional positive training samples 926 and/or additional negative training samples 932.

FIG. 10 is a flowchart of a method 1000 for parsing a specification document associated with a circuit design (e.g., a RTL circuit design) to identify design requirements, in accordance with some embodiments. The method 1000 may be performed by a computing system, such as the requirement extraction system 100. The requirement extraction system 100 receives 1010 a specification document associated with a circuit design. The specification may be in PDF format, text format, doc format, docx format, or any other format that may be applicable.

The requirement extraction system 100 processes 1020 the specification document to identify at least one of (1) a text component, (2) a table component, and/or (3) an FSM component. In some embodiments, processing 1020 the specification document to identify the different components includes for each page of the specification document, identifying a page bounding region. For example, in some embodiments, a header, a footer and/or margins of each page is identified and excluded from the page bounding region. In some embodiments, coordinates associated with page boundaries are identified. In some embodiments, for each page, table components and FSM components are identified, and text associated with the identified table components and FSM components are extracted. All text in each page is also identified. The text associated with the table components and FSM components are subtracted from all text identified from the corresponding page. The resulting text (excluding the text in the table or FSM components) is used as text components.

The requirement extraction system 100 parses 1030 the text component to identify a first set of design requirements. In some embodiments, parsing the text component includes parsing the text component using a natural language processor to identify sentences and verbs in the sentences. In some embodiments, sentences that include no verb are generally ignored. In some embodiments, short sentences that have no more than 4 words are also ignored. After that, one or more ML models are then used to predict whether an identified sentence (that includes a verb and is more than 4 words long) is likely to be a design requirement.

In some embodiments, the ML models are trained over one or more training datasets having (1) positive training samples containing a first set of phrases each of which is labeled as a design requirement, and (2) negative training samples containing a second set of phrases each of which is labeled as not a design requirement. In some embodiments, the one or more ML models include different models trained for identifying different types of design requirements. For example, in some embodiments, a first ML model is trained to predict whether an identified sentence is likely to be a protocol requirement; a second ML model is trained to predict whether an identified sentence is likely to be a function requirement, and/or a third ML model is trained to predict whether an identified sentence is likely to be a coverage requirement.

The requirement extraction system 100 may also parse 1040 the table component to identify a second set of design requirements. In some embodiments, parsing the table component includes determining that a horizontal relationship or a vertical relationship is present in the table component. Responsive to determining that a horizontal relationship is present, the requirement extraction system 100 extracts row headers of rows in the table, generates a graph having values in each row as child nodes of the corresponding row header, and extracts column headers of columns in the table as constraints. Similarly, responsive to determining that a vertical relationship is present, the requirement extraction system 100 extracts column headers of columns in the table, generates a graph having values in each column as child nodes of the corresponding column header, and extracts row headers of rows in the table as constraints.

The requirement extraction system 100 may also parse 1050 the FSM component to identify a third set of design requirements. In some embodiments, parsing the FSM component includes identifying one or more circles and one or more arrows in the FSM component, and extracting text information from the identified one or more circles. The requirement extraction system 100 then generates a graph based on the text information, the one or more circles, and the one or more arrows. The one or more circles correspond to one or more nodes of the graph, and the one or more arrows correspond to relationship among the one or more nodes of the graph.

The requirement extraction system 100 presents the identified design requirement(s) to a user for review. In some embodiments, the specification document is a PDF file, and presenting the identified design requirement includes the PDF file at locations where each design requirement in the first, second, and/or third sets of design requirements is located.

In some embodiments, the requirement extraction system 100 is also configured to receive user feedback. In some embodiments, responsive to receiving a user feedback indicating that a design requirement in the first set of design requirements is a wrong prediction, the requirement extraction system 100 includes the wrong prediction in the training dataset as a negative training sample. In some embodiments, responsive to receiving a user feedback indicating that a design requirement is a missed prediction, the requirement extraction system 100 includes the missed prediction in the training dataset as a positive training sample.

In some embodiments, responsive to receiving a user feedback indicating a design requirement in the first set of design requirements is a correct prediction, the requirement extraction system 100 compares a vector corresponding to the correct prediction with vectors of the positive training samples in the training dataset to determine a similarity index. Responsive to determining that the similarity index is lower than a threshold, the requirement extraction system 100 includes the missed prediction in the training dataset as a positive training sample.

Figure 11:
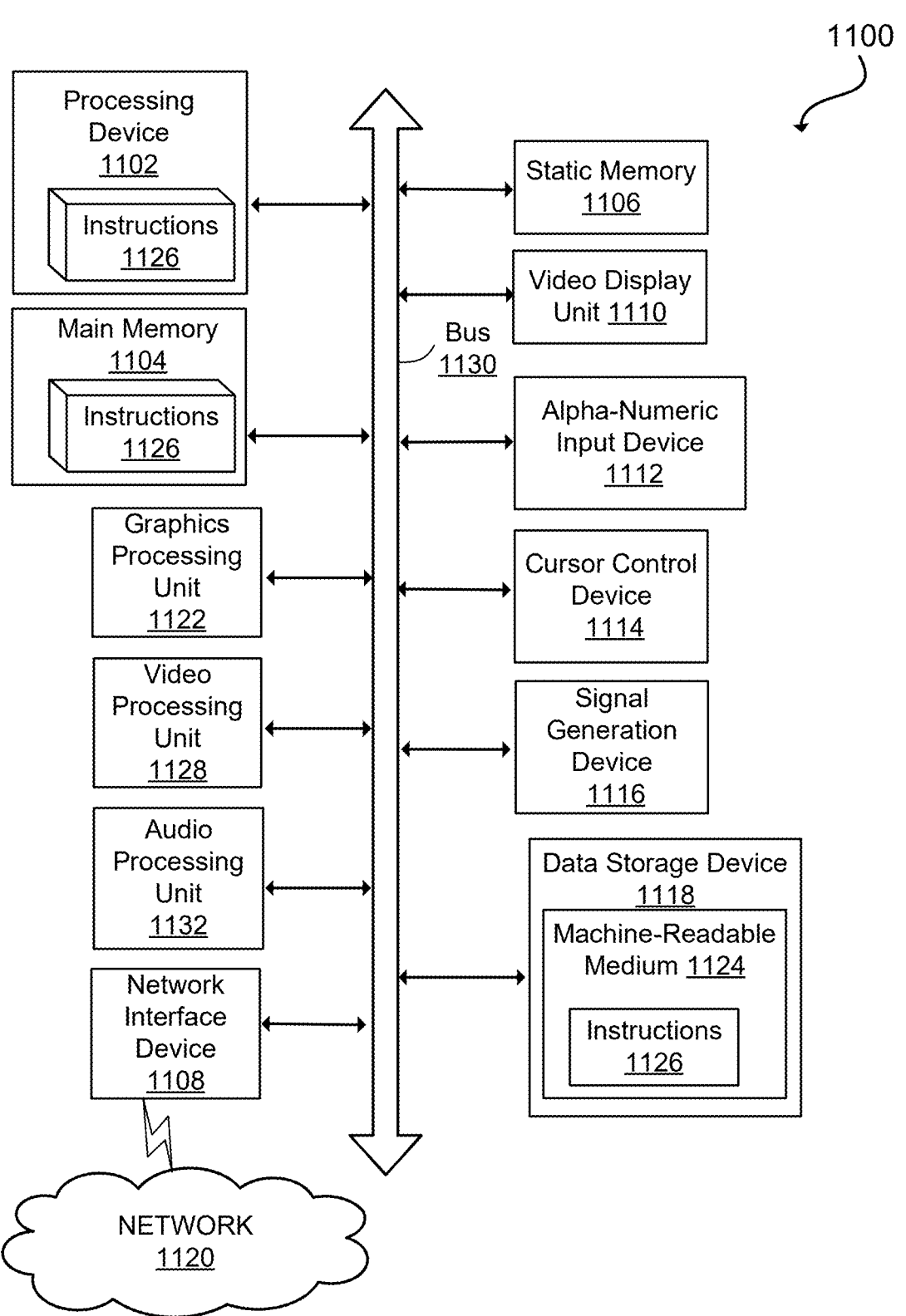
FIG. 11 illustrates an example machine of a computer system within which a set of instructions, for causing the machine to perform any one or more of the methodologies discussed herein, may be executed.

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a local area network (LAN), an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
receiving a specification document associated with a circuit design;
processing the specification document to identify a text component, a table component, and a finite state machine (FSM) component;
parsing, by a first parser, the text component to identify a first set of design requirements, parsing the text component including using one or more machine-learning (ML) models to predict whether an identified sentence is likely to be a design requirement, at least one of the one or more ML models trained over a training dataset having (1) positive training samples containing a first set of phrases each of which is labeled as a design requirement, and (2) negative training samples containing a second set of phrases each of which is labeled as not a design requirement;
parsing, by a second parser, the table component to identify a second set of design requirements;
parsing, by a third parser, the FSM component to identify a third set of design requirements; and
providing for display the identified at least one of first, second, and third sets of design requirements.

2. The method of claim 1, wherein the circuit design is a register-transfer level (RTL) circuit design.

3. The method of claim 1, wherein the specification document is a PDF file, and presenting the identified first, second, or third sets of design requirements includes annotating the PDF file at locations where each design requirement in the first, second, or third sets of design requirements is located.

4. The method of claim 1, wherein parsing, by the first parser, the text component includes:
parsing the text component using a natural language processor to identify sentences and verbs in the sentences.

5. The method of claim 4, wherein the one or more ML models include at least one of (1) a first ML model trained to predict whether an identified sentence is likely to be a protocol requirement, (2) a second ML model trained to predict whether an identified sentence is likely to be a function requirement, or (3) a third ML model trained to predict whether an identified sentence is likely to be a coverage requirement.

6. The method of claim 4, the method further comprising:
receiving a user input indicating that a design requirement in the first set of design requirements is a wrong prediction; and
including the wrong prediction in the training dataset as a negative training sample.

7. The method of claim 4, the method further comprising:
receiving a user input indicating that a design requirement in the first set of design requirements is a missed prediction; and
including the missed prediction in the training dataset as a positive training sample.

8. The method of claim 4, the method further comprising:
receiving a user input indicating the first set of design requirements is a correct prediction;
comparing a vector corresponding to the correct prediction with vectors of the positive training samples in the training dataset to determine a similarity index; and
responsive to determining that the similarity index is lower than a threshold, including the correct prediction in the training dataset as a positive training sample.

9. The method of claim 1, wherein parsing, by the second parser, the table component includes:
determining that a horizontal relationship or a vertical relationship is present in the table component;
responsive to determining that a horizontal relationship is present,
extracting row headers of rows in the table;
generating a graph having values in each row as child nodes of the corresponding row header; and
extracting column headers of columns in the table as constraints;
responsive to determining that the vertical relationship is present,
extracting column headers of columns in the table;
generating a graph having values in each column as child nodes of a corresponding column header; and
extracting row headers of rows in the table as constraints.

10. The method of claim 1, wherein parsing, by the third parser, the FSM component includes:
identifying one or more circles and one or more arrows in the FSM component;
extracting text information from the identified one or more circles; and
generating a graph based on the text information, the one or more circles, and the one or more arrows, wherein the one or more circles correspond to one or more nodes of the graph, and the one or more arrows correspond to relationship among the one or more nodes of the graph.

11. A non-transitory computer readable medium comprising stored instructions, which when executed by a processor, cause the processor to:

receive a specification document associated with a circuit design;

process the specification document to identify a text component, a table component, and a finite state machine (FSM) component;

parse, by a first parser, the text component to identify a first set of design requirements, parsing the text component including using one or more machine-learning (ML) models to predict whether an identified sentence is likely to be a design requirement, at least one of the one or more ML models trained over a training dataset having (1) positive training samples containing a first set of phrases each of which is labeled as a design requirement, and (2) negative training samples containing a second set of phrases each of which is labeled as not a design requirement;

parse, by a second parser, the table component to identify a second set of design requirements;

parse, by a third parser, the FSM component to identify a third set of design requirements; and provide for display the identified at least one of the first, second, and third sets of design requirements.

12. The non-transitory computer readable medium of claim 11, wherein the circuit design is a register-transfer level (RTL) circuit design.

13. The non-transitory computer readable medium of claim 11, wherein the specification document is a PDF file, and presenting the identified first, second, or third sets of design requirements includes annotating the PDF file at locations where each design requirement in the first, second, or third sets of design requirements is located.

14. The non-transitory computer readable medium of claim 11, wherein parsing, by the first parser, the text component includes:

parsing the text component using a natural language processor to identify sentences and verbs in the sentences.

15. The non-transitory computer readable medium of claim 14, wherein the one or more ML models includes at least one of (1) a first ML model trained to predict whether an identified sentence is likely to be a protocol requirement, (2) a second ML model trained to predict whether an identified sentence is likely to be a function requirement, or (3) a third ML model trained to predict whether an identified sentence is likely to be a coverage requirement.

16. The non-transitory computer readable medium of claim 14, comprising additional stored instructions, which when executed by a processor, cause the processor to further perform:

receive a user input indicating that the first set of design requirements is a wrong prediction; and include the wrong prediction in the training dataset as a negative training sample.

17. The non-transitory computer readable medium of claim 14, comprising additional stored instructions, which when executed by a processor, cause the processor to further perform:

receive a user input indicating that a requirement is a missed prediction; and include the missed prediction in the training dataset as a positive training sample.

18. The non-transitory computer readable medium of claim 14, comprising additional stored instructions, which when executed by a processor, cause the processor to further perform:

receive a user input indicating the first set of design requirements is a correct prediction;

compare a vector corresponding to the correct prediction with vectors of the positive training samples in the training dataset to determine a similarity index; and responsive to determining that the similarity index is lower than a threshold, include the correct prediction in the training dataset as a positive training sample.

19. The non-transitory computer readable medium of claim 11, wherein parsing, by the second parser, the table component includes:

determining that a horizontal relationship or a vertical relationship is present in the table component;

responsive to determining that a horizontal relationship is present, extracting row headers of rows in the table;

generating a graph having values in each row as child nodes of the corresponding row header; and extracting column headers of columns in the table as constraints;

responsive to determining that the vertical relationship is present, extracting column headers of columns in the table;

generating a graph having values in each column as child nodes of a corresponding column header; and extracting row headers of rows in the table as constraints.

20. A computer system, comprising:

a processor; and non-transitory computer readable medium comprising stored instructions, which when executed by the processor, cause the processor to:

receive a specification document associated with a circuit design;

process the specification document to identify a text component, a table component, and a finite state machine (FSM) component;

parse, by a first parser, the text component to identify a first set of design requirements, parsing the text component including using one or more machine-learning (ML) models to predict whether an identified sentence is likely to be a design requirement, at least one of the one or more ML models trained over a training dataset having (1) positive training samples containing a first set of phrases each of which is labeled as a design requirement, and (2) negative training samples containing a second set of phrases each of which is labeled as not a design requirement;

parse, by a second parser, the table component to identify a second set of design requirements;

parse, by a third parser, the FSM component to identify a third set of design requirements; and provide for display the identified at least one of the first, second, and third sets of design requirements.

* * * * *